United States Patent [19]

Roth et al.

[11] Patent Number: 4,626,497
[45] Date of Patent: Dec. 2, 1986

[54] PROCESS FOR THE PRODUCTION OF COLORED PHOTOGRAPHIC POLYMER IMAGES

[75] Inventors: Martin Roth; Beat Müller; Joseph Berger, all of Marly; Peter Loew, Münchenstein, all of Switzerland

[73] Assignee: Ciba-Geigy AG, Basel, Switzerland

[21] Appl. No.: 738,156

[22] Filed: May 24, 1985

Related U.S. Application Data

[60] Continuation of Ser. No. 628,890, Jul. 9, 1984, abandoned, which is a division of Ser. No. 297,604, Aug. 31, 1981, abandoned, which is a continuation of Ser. No. 147,783, May 8, 1980, abandoned.

[30] Foreign Application Priority Data

May 18, 1979 [CH] Switzerland ............... 4673/79

[51] Int. Cl.[4] ............................. G03C 5/00
[52] U.S. Cl. .......................... 430/293; 430/9; 430/17; 430/271; 430/518
[58] Field of Search ............ 430/270, 271, 293, 518, 430/9, 17; 526/262; 204/159.14, 159.22

[56] References Cited

U.S. PATENT DOCUMENTS

| | | | |
|---|---|---|---|
| 3,182,029 | 5/1965 | Chu et al. | 430/518 |
| 3,408,193 | 10/1968 | Wolf et al. | 430/518 |
| 3,575,993 | 9/1971 | Heseline et al. | 430/518 |
| 3,625,691 | 12/1971 | Ohyama et al. | 430/518 |
| 3,702,766 | 11/1972 | Dunham et al. | 96/75 |
| 3,920,618 | 11/1975 | Ichimura et al. | 96/33 |
| 4,088,489 | 5/1978 | Rubner et al. | 96/115 R |
| 4,158,730 | 6/1979 | Baumann et al. | 528/273 |

Primary Examiner—Jack P. Brammer
Attorney, Agent, or Firm—Joseph G. Kolodny

[57] ABSTRACT

A light-sensitive recording material which provides polymer images and contains, on a base, a layer of a photocrosslinkable polymer with an average molecular weight of $10^3$ to $10^6$, the copolymer having been prepared from (1) a (meth)acrylate, (meth)acrylamide or vinyl ether derivative which contains at least one maleimide group of the formula

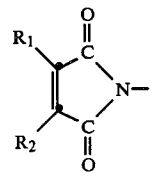

in which $R_1$ and $R_2$ are each alkyl having 1 to 4 carbon atoms, or $R_1$ and $R_2$ together with the carbon atoms to which they are bonded form a 5-membered or 6-membered carbocyclic ring, (2) an ethylenically unsaturated comonomer containing acid groups, this comonomer being present in an amount of at least 18 percent by weight, based on the total amount of the comonomers, and, optionally, (3) at least one further ethylenically unsaturated comonomer which differs from the comonomers (1) and (2).

5 Claims, No Drawings

PROCESS FOR THE PRODUCTION OF COLORED PHOTOGRAPHIC POLYMER IMAGES

This is a continuation of application Ser. No. 628,890 filed July 9, 1984, abandoned, which is a divisional of Ser. No. 297,604 filed Aug. 31, 1981, abandoned, which is a continuation of Ser. No. 147,783 filed May 8, 1980, abandoned.

The present invention relates to photocrosslinkable copolymers, a light-sensitive recording material, which contains, on a base, one layer containing at least one photocrosslinkable polymer, the side chains of which have photoactive maleimide groupings, and also a simplified processing procedure for the production of coloured photographic polymer images.

Crosslinkable polymeric compounds which contain photoactive maleimide groupings in the side chains and are suitable for the production of polymer images by image-wise exposure have already been disclosed in German Offenlegungsschrift No. 2,626,769. After exposure, the portions which have not been crosslinked are dissolved out with a solvent and the image is stained by subsequent treatment with a dye dissolved in a solvent. This step-wise production of the polymer images has various disadvantages. Thus, as a rule a change in the degree of swelling of the crosslinked polymer takes place between washing out and staining and this on the one hand leads to a reduction in the quality of the image and on the other hand can considerably impair the adhesion of the polymer image to the base, since partial or complete loosening of the polymer image can occur. A further disadvantage is the considerable time demanded by the step-wise production of the polymer images.

The object of the present invention is to provide a novel, simplified process for the production of polymer images, which requires a short processing time and only a few processing steps and nevertheless allows the user wide latitude with regard to the choice of the colour and the optical density of the image and thus to the application of the image material, and also to provide novel photocrosslinkable copolymers and novel light-sensitive recording materials for the production of polymer images, which materials, by virtue of their composition, permit processing by the simplified process and result in polymer images with a high optical density and good resolution.

It has now been found that the specified objects can be achieved according to the invention by treating photopolymers, which have specific proportions of acid or basic groups and have been exposed image-wise (and thus crosslinked), during developing, with aqueous or aqueous-organic solutions which have an alkaline or acid reaction and contain dye, and then washing out and drying.

The present invention thus relates to a light-sensitive recording material which contains, on a base, one layer of a photocrosslinkable polymer, the side chains of which have photoactive maleimide groupings, wherein the layer contains at least one copolymer which has an average molecular weight of $10^3$ to $10^6$ and is obtained from (1) a (meth)acrylate, (meth)acrylamide or vinyl ether derivative which contains at least one maleimide group of the formula

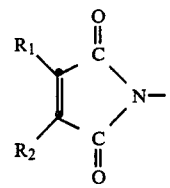

in which $R_1$ and $R_2$ are each alkyl having 1 to 4 carbon atoms, or $R_1$ and $R_2$ together with the carbon atoms to which they are bonded form a 5-membered or 6-membered carbocyclic ring, (2) an ethylenically unsaturated comonomer containing acid groups, this comonomer being present in an amount of at least 18 percent by weight, based on the total amount of the comonomers, and, optionally, (3) at least one further ethylenically unsaturated comonomer which differs from the comonomers (1) and (2).

The invention further relates to the photocrosslinkable copolymer present in the said recording material according to the present invention and also to a process for the production of photographic images using the recording material according to the present invention and, optionally, further recording materials which contain polymers with acid groups, by developing these materials, after they have been exposed image-wise, with an alkaline, aqueous or aqueous-organic solution which contains a cationic dye, and then washing and drying.

The invention also relates to a process for the production of photographic images using a polymeric recording material which contains photocrosslinkable polymers containing maleimide side chains and basic groups, by developing the material, which has been exposed image-wise, with an acid, aqueous or aqueous-organic solution which contains an anionic dye, and then washing and drying.

The following copolymers are suitable for the preparation of the recording material according to the present invention and for the production of photographic images by the process according to the present invention:

The copolymers are those which are obtained by copolymerisation of diverse monomers having reactive carbon-carbon double bonds. The copolymers contain, on average, more than two maleimide groupings of the formula (1) per mol and are crosslinkable under the influence of electromagnetic waves. Their average molecular weight is at least $10^3$ and is as a rule in the range from $10^3$ to $10^6$.

In particular, the following polymers can be used:

(A) Copolymers which are obtained from monomers containing reactive C=C double bonds, have average molecular weights between $10^3$ and $10^6$ and contain the maleimide groups of the formula (1) in molecule chain members of the formulae

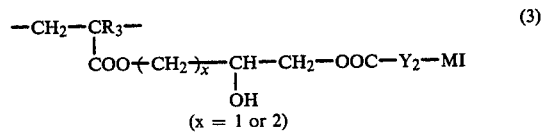

-continued

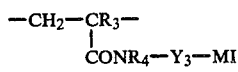  (4)

or

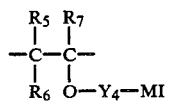  (5)

in which MI is the maleimide group of the formula (1) and $Y_2$ is an aliphatic, cycloaliphatic, carbocyclic-aromatic, araliphatic, heterocyclic-aliphatic or heterocyclic-aromatic bridge member having, in each case, a total of not more than 18 carbon atoms, $Y_1$ is as defined for $Y_2$ or is the grouping of the formula

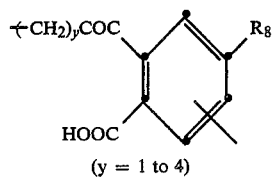  (6)

(y = 1 to 4)

$Y_3$ is as defined for $Y_2$ or is the grouping —CO—$Y_2$, $Y_4$ is as defined for $Y_2$ or preferably is an aliphatic or carbocyclic-aromatic radical, $R_3$ is hydrogen or alkyl, preferably methyl, $R_4$ is hydrogen or alkyl having 1 to 6 carbon atoms, $R_5$, $R_6$ and $R_7$ independently of one another are hydrogen, halogen, cyano, alkyl, aryl or aralkyl, but preferably hydrogen, and $R_8$ is hydrogen, —COOH or —COO(CH$_2$)$_z$CH$_3$ (z=0 to 18).

The following applies in principle with regard to the chemical formulae given: if divalent radicals of a molecule which are characterised by a symbol (for example "Y") and which represent parts of a basic formula are illustrated in more detail by subsequent formulae, these divalent radicals are spatially always shown so that they can be incorporated in the basic formula without rotation. The right/left arrangements both in the basic formula and in the formula for the particular divalent radical, of the molecule, illustrated in more detail are thus to be left unchanged.

Preferred comonomers (1) have the formulae

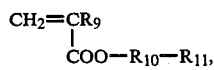  (7)

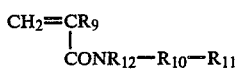  (8)

or

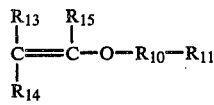  (9)

in which $R_9$ is hydrogen or methyl, $R_{10}$ is straight-chain or branched alkylene having 1 to 12 carbon atoms or cycloalkylene having 5 or 6 carbon atoms, $R_{11}$ is a maleimide grouping of the formula

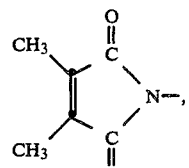  (10)

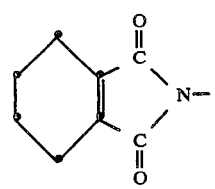  (11)

or

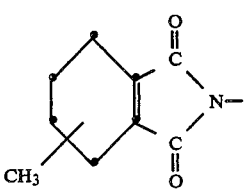  (12)

and $R_{12}$ is hydrogen or alkyl having 1 to 6 carbon atoms and $R_{13}$, $R_{14}$ and $R_{15}$ are each hydrogen, halogen, cyano or alkyl having 1 to 6 carbon atoms.

The comonomers of the formulae (7) and (9) are preferred, the comonomers of the formula (7), for example the compound of the formula

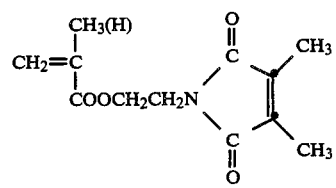  (13)

being particularly suitable.

The content of this monomer determines the crosslinking density of the network formed under the action of light. If the content is too low, the crosslinking and thus the mechanical strength of the layer are inadequate.

In addition to the molecule chain members containing maleimide groups, which have just been described and which can make up 10 to 82% by weight of the copolymer, the copolymers of type (A) contain molecule chain members which are free from maleimide groups and contain acid or basic groups, and also, optionally, additionally contain further chain members free from maleimide groups. The acid chain members can be derived from the following comonomers (2): α,β-unsaturated carboxylic acids, for example acrylic acid, methacrylic acid, maleic acid, fumaric acid, itaconic acid or crotonic acid; monomers containing sulfonic acid groups, for example vinylsulfonic acid and its salts (for example the Na or K salt), 2-sulfoethyl methacrylate or styrene-sulfonic acid, or monomers which contain carboxyl groups and are obtained from the reaction of cyclic acid anhydrides (1 mol) with hydroxyethyl (meth)acrylate (1 mol), for example mono-β-(meth)acryloxy-ethyl phthalate.

The additional chain members which may be used (comonomer (3)) (without acid groups) are derived from the following comonomers: olefins, in particular alkenes, vinyl halides, for example vinyl chloride, vinyl bromide, or vinyl fluoride; vinylidenes, for example vinylidene chloride; nitriles of α,β-unsaturated acids, for example (meth)acrylonitrile; esters of α,β-unsaturated acids (acrylic and methacrylic acid), for example methyl acrylate, ethyl acrylate, propyl acrylate, butyl acrylate, octyl acrylate, 2-ethyl-hexyl acrylate, methyl methacrylate, ethyl methacrylate, isopropyl methacrylate, butyl methacrylate, glycidyl acrylate, glycidyl methacrylate or chloromethyl methacrylate; α,β-unsaturated carboxamides and their derivatives, for example acrylamide or methacrylamide; aromatic vinyl compounds, for example styrene, methylstyrene, vinyltoluene or α-chlorostyrene; vinyl ketones, for example methyl vinyl ketone; vinyl esters, for example vinyl acetate; heterocyclic vinyl compounds, for example vinylpyrrolidone, vinylcarbazole or a vinyl ether.

The copolymers can contain 0 to 72% by weight of recurring units which are derived from the comonomers (3).

The preparation of the copolymers (A) is described in German Offenlegungsschrift No. 2,626,769 and the preparation of the monomers containing maleimide groups is described in German Offenlegungsschrift No. 2,626,795.

Preferred copolymers (A) are those which are prepared from comonomers (2) having free carboxyl groups, such as, in particular, α,β unsaturated acids, such as methacrylic acid, acrylic acid, maleic acid (maleic anhydride) and mono-β-methacryloxy-ethyl phthalate. The resulting polymers are soluble in aqueous alkaline solutions. The content of these acids in the polymer can vary between 18 and 50% by weight and preferably between 20 and 40% by weight. The adjustment of the content of chain members carrying carboxyl groups to the optimum value is essentially determined by the composition and the molecular weight of the copolymers and also by the composition of the developer solution (pH value, dyes). The amount of carboxyl groups should be such that the uncrosslinked polymer is soluble or is at least swollen in the developer solution. However, if the amount of carboxyl groups is too large, the relief image then swells too greatly during the developing process and this can result in a lowering of the adhesion to the layer base and possibly to loosening of the image.

In addition, the carboxyl groups enable the image area crosslinked image-wise by actinic light to be stained with cationic dyes. The maximum achievable colour density of the image accordingly depends, inter alia, on the carboxyl group content of the copolymers.

Copolymers which are particularly suitable for the process according to the invention for the production of photographic images using recording materials which contain photocrosslinkable copolymers with maleimide side chains and basic groups are those in which the basic groups are introduced into the copolymer using carboxylic acid derivatives which carry dialkylamino groups and are obtained from α,β-unsaturated carboxylic acids, or nitrogen-heterocyclic vinyl compounds, as the comonomers. Suitable basic comonomers are, for example: comonomers from the series comprising the vinylpyridine compounds, for example 2-vinylpyridine or 4-vinylpyridine, and acrylates or amides with basic substituents (carrying dialkylamino) groups, for example dimethylaminoethyl (meth)acrylate, diethylaminoethyl (meth)acrylate, dimethylaminopropyl (meth)acrylate, diethylaminopropyl (meth)acrylate, dimethylaminopropylmethacrylamide or diethylaminopropylmethacrylamide.

Further copolymers which are suitable for the process according to the invention for the production of photographic images using recording materials which contain copolymers with acid groups are (B) Copolymers which are obtained from monomers containing reactive C=C double bonds and have average molecular weights between $10^3$ and $10^6$ and which contain the maleimide groups of the formula (1) in molecule chain members of the formulae

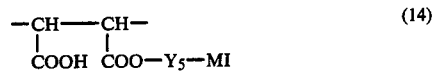

(14)

or

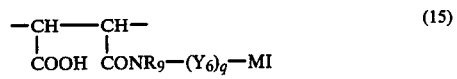

(15)

in which $Y_5$ is an aliphatic, cycloaliphatic, carbocyclic-aromatic, araliphatic, heterocyclic-aliphatic or heterocyclic-aromatic radical, having, in each case, a total of not more than 18 carbon atoms, or is the grouping of the formula $-CH_2CH(OH)(CH_2)-_n$, $Y_6$ is an aliphatic, cyclo-aliphatic, carbocyclic-aromatic, araliphatic, heterocyclic-aliphatic or heterocyclic-aromatic radical having, in each case, a total of not more than 18 carbon atoms, q is 0 or 1, $R_9$ is hydrogen or alkyl having 1 to 6 carbon atoms and MI is the maleimide group of the formula (1).

Particularly suitable copolymers are those obtained from maleic anhydride and α,β-unsaturated comonomers (for example the comonomers (2) and (3) mentioned further above), the side chains of these copolymers containing the maleimide groupings of the formula (1), in particular in the form of the molecule chain members indicated above. The content of comonomers containing acid groups or of comonomers which form acid groups (maleic anhydride opening of the anhydride ring by chemical reaction) in the copolymer can as a rule be 10 to 90 and in particular up to 50% by weight.

Preferred processes for the preparation of the preferred polymers of type (A) are the following free radical polymerisation processes: (a) polymerisation in solution, (b) precipitation polymerisation and (c) emulsion polymerisation.

The polymers can be purified by conventional known processes, for example by precipitating in a non-solvent for the polymer and then washing and drying.

The reaction products obtained according to (a) and (c) (in the case of a): the solution of the polymer and in the case of (c): the polymer latex) can, however, in a preferred procedure also be coated direct onto the base, optionally after dilution and the addition of assistants, for example sensitisers.

The sensitivity to light of the polymers according to the invention is very considerably increased by sensitisers. It is possible to adjust the sensitivity so that it is suited, in a maximum manner, to the light from diverse commercially available copying lamps, for example metal/halogen lamps, by a suitable choice of sensitisers.

Suitable sensitisers are, in particular, triplet sensitisers: when these are used crosslinking is effected by triplet energy transfer from the excited sensitiser to the maleimide radical of the formula (1), which is not in the excited state; in this context cf. N. J. Turro, "Mol. Photochemistry", W. A. Benjamin Inc. [1965], page 107. The two conditions for effective sensitising are as follows:

1. The triplet sensitiser must have an absorption maximum which permits adequate light absorption in practice in the range above 300 nm.
2. The triplet energy transfer must be exothermic. For example, the following sensitisers can be used: benzene, phenol, benzoic acid, benzonitrile, aniline, xanthone, acetophenone, diisopropyl ketone, diphenyl sulfide, diphenylamine, benzaldehyde, diphenyl selenide, carbazole, triphenylamine, hexachlorobenzene, 4,4-diphenylcyclohexadiene, 1,2-dibenzoylbenzene, thiophen, benzophenone, 1,4-diacetylbenzene, fluorene, triphenylene, 4-cyanobenzophenone, diphenyl, thioxanthone (including halogen-substituted thioxanthone), phenylglyoxal, anthraquinone, quinoline, phenanthrene, flavone, Michler's ketone, naphthalene, 4-acetyldiphenyl, nitrobenzene, 2-acetonaphthene, acridine yellow, 1-naphthyl phenyl ketone, chrysene, 1-acetonaphthol, 1-naphthaldehyde, diacetyl, coronene, benzil, fluorenone, fluorescein (acid), p-nitrostilbene, anthrone, benzanthrone, 2-nitrofluorene, substituted or unsubstituted quinoxaline, 4-nitrodiphenyl, 5-nitroacenaphthene, 4-nitroaniline, naphthothiazoline and 1-acetylamino-4-nitronaphthalene.

The triplet yield and thus the sensitivity can be increased by the introduction of elements with a high atomic weight, for example iodine or bromine.

Sensitisers which are particularly well suited for copying light of 400–420 nm (metal/halogen) are substituted thioxanthones, for example alkyl esters of 6-carboxy-2-methyl-thioxanthone. The sensitisers are preferably employed in amounts of 0.1–10% by weight, based on the weight of the copolymer. It is also possible to use combinations of several different sensitisers.

Layer supports which can be used are the conventional known layer supports, the use of which is known for the preparation of photographic materials of the type according to the invention. Films of poly(ethylene terephthalate), cellulose acetate, cellulose acetate-propionate, cellulose acetate-butyrate, polyethylene or polypropylene are preferably used. It is also possible to use fibrous substances, for example papers, which can be coated with polyethylene and/or polypropylene; supports of glass and metals, for example aluminium, copper, magnesium or zinc, can also be suitable.

The photographic materials according to the invention can be prepared by the conventional known coating processes.

As a rule, the copolymers are dissolved in organic solvents and applied to the base materials.

The layer thickness which is most advantageous for the layer applied in a particular case depends on the intended use of the material prepared. Preferred layer thicknesses are in the range of 0.5–15 $\mu$m.

Light sources suitable for exposure of the particular material are those which emit an effective amount of radiation in the range of the absorption bands of the sensitiser. Since many of the sensitisers mentioned display absorption between 300 nm and 450 nm, preferred light sources are those which emit a high proportion of radiation in this range. Both point light sources and bar lights (floodlighting) are suitable. Examples are: carbon arc lamps, xenon arc lamps, mercury discharge lamps, which can be doped with metal/halide (metal/halogen lamps), fluorescent lamps with fluorescent materials which radiate UV light, argon incandescent lamps, electronic flashlamps and photographic floodlight lamps. The distance between the lamp and the image material according to the invention can vary, for example between 2 cm and 150 cm, depending on the intended use and the type or power of the lamp. In certain cases it can be advantageous to effect exposure with visible light using a photoinitiator which is sensitive in the visible range of the spectrum. In such cases, the radiation source should emit an effective amount of visible light.

Many of the light sources mentioned above provide the requisite amount of visible light. It is also possible to crosslink the polymers image-wise without a sensitiser. This requires light sources which emit light in the range of the absorption bands of the maleimide groups of the formula (1), i.e. between about 200 and 350 nm. For example, low-pressure or medium-pressure mercury discharge lamps are suitable.

Processing of the exposed material to the finished image should be as simple as possible and should proceed without the emission of dangerous chemical harmful substances, for example certain volatile solvents. In order to leave the user a wide degree of latitude, manual processing and machine processing (processor) should be possible with the same image material and the same developer solutions. In order to provide the material with a wide range of application (for example as a contact mask for the exposure of printing formes and as a microfilm), staining of the relief should take place during the developing process, since the user can then very simply determine the colour and the depth of colour of the image with the same image material by appropriate choice of the developer solution, i.e. any desired monochrome images can be produced with a single film material.

The processes according to the invention meet the said requirements with respect to the processing procedure.

The photocrosslinkable polymer material is exposed through an original to actinic radiation, the light-sensitive layer being crosslinked image-wise. On developing, this layer is treated with an aqueous solution which has an alkaline, neutral or acid reaction and contains a dye. The solution diffuses into the light-sensitive layer, which has been crosslinked image-wise, and, depending on the developing time, penetrates through the entire layer (down to the base) or through only part of the layer. The parts of the image which have not been crosslinked and which come into contact with the solution (i.e. within the developer front) can already dissolve out at this stage; at the latest, however, they dissolve out during the subsequent washing. In addition, the image areas which come into contact with the solution are stained with the dye.

The material is then rinsed with water in order to wash away excess dye and the parts of the image which have not been crosslinked. A coloured relief image remains, the relief having been washed out down to the base, or not down to the base if the times for which the developer solution has acted on the material have been shorter, in which latter case the relief is on a thin layer of photocrosslinkable polymer, which has not been stained. In this latter case, this results in considerably better adhesion of the relief in the moist and swollen state to the base material and this manifests itself in improved mechanical strength of the material and thus in better handling characteristics.

As a result of the combined use of solvent (aqueous alkali or aqueous acid) and dye in the same solution, the processing time is considerably shortened and processing is simplified. Moreover, a change in the degree of swelling between washing out and staining, such as has resulted in a reduction in the quality of the image (accuracy of reproduction) in the case of the methods customarily used hitherto, does not take place.

In addition to the recording material described (polymers with acid or basic groups), the composition of the developer solution plays an important role, as indicated. This solution consists essentially of an aqueous base or acid (or neutral water) in which cationic or anionic dyes have been dissolved, and also, if desired, assistants, for example wetting agents, stabilisers and water-soluble organic solvents. Examples of suitable bases are the alkali metal hydroxides, such as lithium hydroxide, sodium hydroxide and potassium hydroxide, those alkali metal salts of weak acids which have a basic reaction, such as lithium carbonate and bicarbonate, sodium carbonate and bicarbonate and potassium carbonate and bicarbonate, ammonium hydroxide and trialkyl-substituted ammonium hydroxides, such as triethylammonium hydroxide, tributylammonium hydroxide and trishydroxyethylammonium hydroxide, tetra-substituted ammonium hydroxides, such as tetramethyl-, tetraethyl-, trimethylbenzyl- and trimethylphenyl-ammonium hydroxide, sulfonium hydroxides, such as trimethyl-, diethylmethyl- and dimethylbenzyl-sulfonium hydroxide and their soluble basic salts, for example carbonates, bicarbonates and sulfides, alkali metal phosphates and alkali metal pyrophosphates, for example sodium triphosphate, potassium triphosphate, sodium pyrophosphates and potassium pyrophosphates, tetra-substituted (all of these substituents preferably being alkyl) phosphonium hydroxide, arsonium hydroxide and stibonium hydroxide, such as tetramethylphosphonium hydroxide, and alkali metal borates, such as lithium tetraborate, sodium tetraborate or potassium tetraborate.

Suitable acids are mineral acids, such as sulfuric acid, hydrochloric acid and nitric acid, organic carboxylic acids, such as acetic acid, maleic acid, tartaric acid or citric acid, or organic sulfonic acids, such as p-toluenesulfonic acid.

The choice of the suitable base or acid depends on the composition of the photocrosslinkable layer and on the dyes present in the same solution. To a certain extent it is also possible to adjust the optical density of the image to a desired value by suitable choice of the pH value of the solution. The preferred concentrations of the bases or acids in the aqueous solution are in the range of 0.01–20% by weight.

The dyes present together with the base or acid in the same solution can be cationic or anionic dyes. Amongst the large number of possible compounds, suitable compounds are those which dissolve in adequate concentration in the basic or acid developer and are stable in this solution for a sufficient time. Single dyes or mixtures can be used. Preferred concentrations are in the range of 0.01–10% by weight, based on the developer solution. The optical density of the stained image can by changed by varying these dye concentrations. The dye concentration influences the solubility of the photocrosslinkable polymer layer in the developer in such a way that a concentration which is too high can result in insolubility of the polymer.

It is therefore important that a specific concentration range be maintained. The absorption bands of the dyes can be in the range from 300 to 800 nm. By choosing suitable combinations of dyes it is possible to cover any desired ranges within the spectrum.

The choice of these ranges depends on the application of the particular image material. For use as a contact film for the exposure of printing formes, for example, a high optical density in the range of 350 to 450 nm is necessary. For use as a microfilm copy, for example, a medium optical density can be desirable.

Cationic dyes are as a rule used for polymers containing acid groups, and anionic dyes are as a rule used for polymers containing basic groups. The dyes can belong to very diverse chemical categories; for example, the cationic dyes are azo dyes, such as monoazo, disazo and polyazo dyes, anthraquinone dyes, phthalocyanine dyes, diphenylmethane and triarylmethane dyes, naphtholactam, methine, polymethine and azomethine dyes and enamine, hydrazone, thiazole, ketone-imine, acridine, cyanine, nitro, quinoline, benzimidazole, xanthene, azine and thiazine dyes. Preferred cationic dyes are azo, anthraquinone, azacyanine and oxazine dyes.

Preferred anionic dyes are, for example, monoazo, disazo and polyazo dyes, as well as anthraquinone dyes.

For example, dyes of the following formulae can be used:

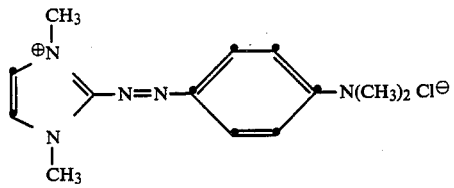 (16)

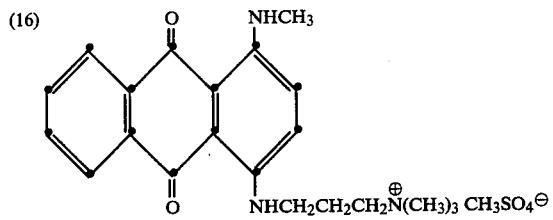 (17)

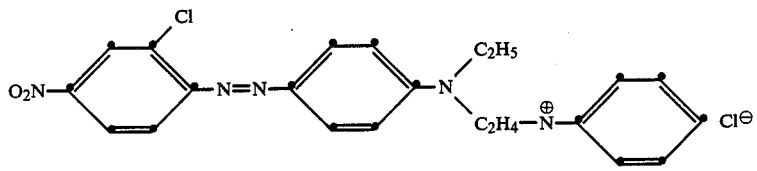 (18)

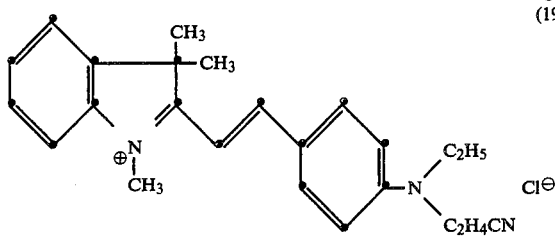
(19)

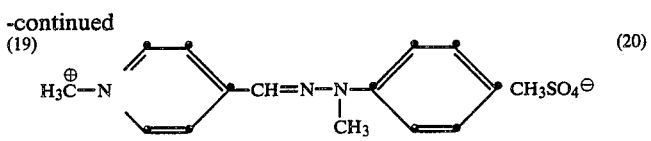
-continued
(20)

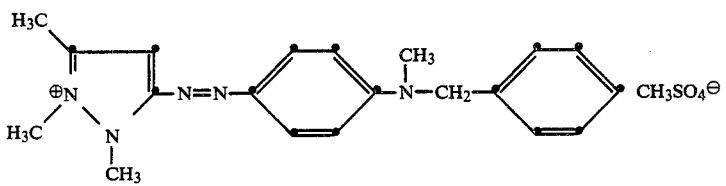
(21)

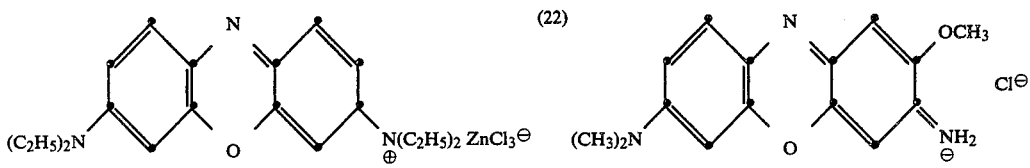
(22) (23)

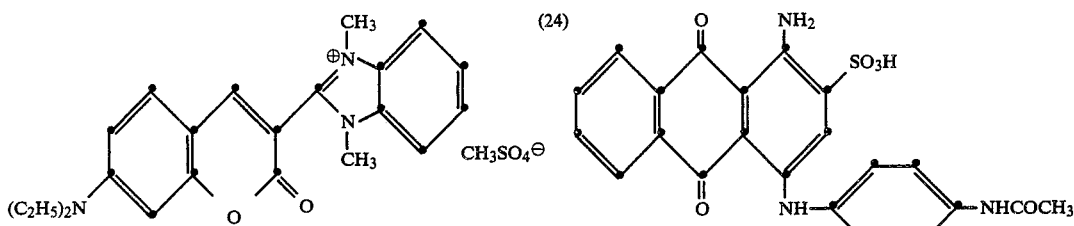
(24) (25)

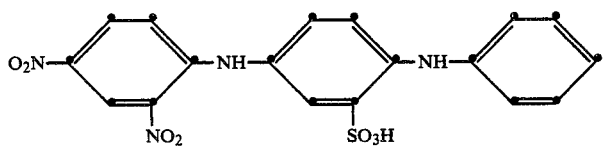
(26)

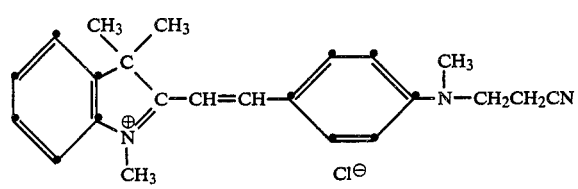
(27)

In addition, the developer solution can contain water-soluble, organic solvents. These organic solvents can improve the solubility in the developer of the parts of the layer which have not been crosslinked and/or can contribute to better solubility of the dyes in the developer solution. The content of such solvents can be between 0.1 and 80% by weight. Examples of suitable solvents are alcohols, such as methanol, ethanol and butanol; glycols, such as ethylene glycol and diethylene glycol; glycol ethers, such as dioxan, dimethoxyethane, diethylene glycol diethyl ether and diethylene glycol dibutyl ether; ketones, such as acetone and methyl ethyl ketone, and amides, such as dimethylformamide.

In addition, surface-active wetting agents can also be added to the developer, to improve wetting.

Possible applications for the materials and processes according to the invention are, for example, contact films (contact masks) for exposing printing formes, for example lithographic printing plates or letterpress printing plates; and also for the production of blocks, tracing films for the graphic and cartographic trade, for example for the reproduction of engineering drawings, plans or circuits, for the production of microfilm copies (high resolution of the recording materials described). The material is also particularly suitable for the copying of computer data recorded on silver halide film ("master") (COM). The silver halide films can contain black symbols or letters on a transparent background, i.e. they do not have to be processed by complex reversal development, which takes a long time. The copy on the material according to the invention then consists of transparent characters on a coloured background.

In addition, the material is used for the production of coloured transparencies, for example for advertising purposes, and also in colour testing processes.

In the examples which follow parts and percentages are by weight, unless indicated otherwise.

LIST OF ABBREVIATIONS

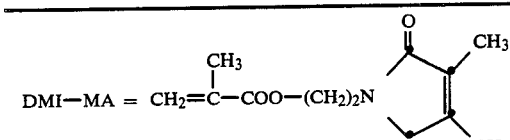

(dimethylmaleimidoethyl methacrylate)

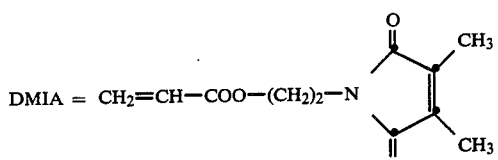

(dimethylmaleimidoethyl acrylate)

AA = acrylic acid
MAA = methacrylic acid
MEK = methyl ethyl ketone
MCS = methylcellosolve (ethylene glycol monomethyl ether)
AIBN = α,α'-azo-bis-isobutyronitrile
inh. V. = inherent viscosity of a 0.5% solution in 1:1 MEK/MCS at 25° C.
EA = ethyl acrylate
MMA = methyl methacrylate
DC = dodecylmercaptan
BuMA = butyl methacrylate
VC = vinylidene chloride
TX = thioxanthone
MPA = mercaptopropionic acid
4VP = 4-vinylpyridine
DMAEMA = N,N—Dimethylaminoathyl-methacrylat
DMI—VA = Dimethylmaleinimidoathyl-vinylather

EXAMPLE 1

Copolymer of

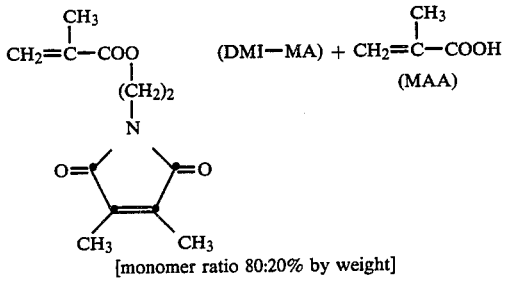

[monomer ratio 80:20% by weight]

The following mixture is initially introduced into a 3,000 ml reactor provided with a mechanical stirrer, a nitrogen inlet/outlet and a dropping funnel with pressure equalisation: 300 g of dimethylmaleimidoethyl methacrylate (stabilised with 0.05% of di-tert.butyl-p-cresol), 75 g of methacrylic acid (freshly distilled) and 2,080 g of a 1:1 (V/V) solvent mixture of methyl ethyl ketone/methylcellosolve.

The dropping funnel is charged with a solution of 2.25 g of azo-bis-isobutyronitrile (AIBN) in 45 g of 1:1 methyl ethyl ketone/methylcellosolve.

After providing an inert atmosphere with nitrogen, ⅓ of the initiator solution is allowed to run in from the dropping funnel and the reactor is brought to a thermostat-controlled internal temperature of 65° C. The reaction mixture is kept at 65° C. for a total of 22 hours, with stirring, the second third of the initiator solution being added after 4 hours and the final third being added after a further 4 hours.

A sample of the viscous, colourless polymer solution is precipitated in ether and the solid polymer is filtered off and dried. A polymer yield of 95.2% and an inherent viscosity of 0.204 dl/g are determined.

The approximately 15% polymer solution can be used direct for coating.

EXAMPLE 2

Copolymer of: DMI-MA+MAA [70:30% by weight]

Using the process according to Example 1, 49.0 g of DMI-MA, 21.0 g of MAA, 385.0 g of 5:1 (V/V) methyl ethyl ketone/methylcellosolve and 0.420 g of AIBN in 10 g of 5:1 (V/V) MEK/MCS are polymerised.

The polymer yield is quantitative after 22 hours at 65° C. Inherent viscosity=0.238 dl/g.

The approximately 15% polymer solution is used direct for coating.

EXAMPLE 3

Copolymer of DMI-MA+MAA+ethyl acrylate (EA) [60:20:20% by weight]

Using the process according to Example 1, 52.5 g of DMI-MA, 17.5 g of MAA, 17.5 g of EA (destabilised), 485.0 g of 20:1 (V/V) methyl ethyl ketone/methylcellosolve and 0.525 g of AIBN in 10 g of MEK/MCS (20:1) are polymerised.

Polymer yield after 22 hours at 65° C.: 88%. Inherent viscosity=0.248 dl/g.

The approximately 15% polymer solution is used direct for coating.

EXAMPLE 4

Copolymer of: DMI-MA+MAA+methyl methacrylate (MMA) [60:25:15% by weight]

Using the process according to Example 1, 42.0 g of DMI-MA, 17.5 g of MAA, 10.5 g of MMA (destabilised), 385.0 g of 5:1 (V/V) methyl ethyl ketone/methylcellosolve and 0.420 g of AIBN in 10 g of 5:1 MEK/MCS are polymerised.

Polymer yield after 22 hours at 65° C.: 96%. Inherent viscosity=0.200 dl/g.

The approximately 15% polymer solution is used direct for coating.

EXAMPLE 5

Preparation of the compound of the formula

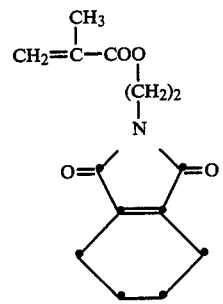

142.5 g (0.94 mol) of Δ-1-tetrahydrophthalic anhydride and 57.2 g (0.94 mol) of ethanolamine are heated together at 130° C. and the water formed is distilled off by applying a slight vacuum.

After 1 hour at 130° C., the reaction product is distilled in vacuo. 169 g (92% of theory) of N-β-hydroxyethyl-tetrahydrophthalimide are obtained. Boiling point 135°-152° C./0.001 mm Hg. Melting point: 48°-51° C.

97.60 g of N-β-hydroxyethyl-Δ-1-tetrahydro-phthalimide, 125.15 g of methyl methacrylate, 3.0 g of hydroquinone and 4.0 ml of concentrated sulfuric acid are heated at 110°-120° C. (bath temperature) under an isolated (vacuum jacket, silvered), 50 cm long Vigreux column with a column head, the methanol/methyl methacrylate azeotrope formed (boiling point about 62°-65°) being separated off continuously. After the formation of methanol has subsided, the reaction product is subjected to fractional distillation in vacuo with the addition of a little sodium carbonate (neutralisation of the sulfuric acid). This yields 97 g (66% of theory) of oily Δ-1-tetrahydro-phthalimidoethyl methacrylate with a boiling point of 145°-151° C./0.2 mm Hg; IR (CHCl$_3$): 1,710 cm$^{-1}$.

EXAMPLE 6

Copolymer of

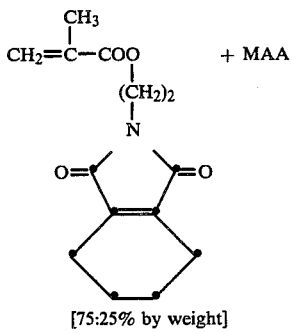

[75:25% by weight]

5.63 g of Δ-1-tetrahydrophthalimidoethyl methacrylate (destabilised), 1.88 g of MAA, 42.50 g of 1:1 (V/V) methyl ethyl ketone/methylcellosolve and 0.045 g of AIBN are polymerised in an ampoule under nitrogen for 22 hours at 65° C. The product is precipitated in ether and 6.12 g (82% yield) of a solid, colourless polymer with an inherent viscosity of 0.142 dl/g are obtained.

EXAMPLE 7

Preparation of

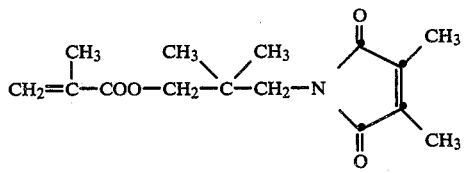

504 g (4.0 mols) of dimethylmaleic anhydride and 408 g (4.0 mols) of neopentanolamine in 1,000 ml of xylene are heated (bath 140° C.) under a water separator. After 2½ hours about 70 ml of water have separated off. The xylene is removed in a rotary evaporator and the residue is distilled in vacuo. This yields 810 g (96% of theory) of neopentanolimide; boiling point: 105°-107° C./0.001 mm Hg; melting point 54°-55° C. 211.3 g of neopentanolimide, 250.0 g of methyl methacrylate, 6.0 g of hydroquinone and 8.0 ml of concentrated sulfuric acid are heated using the process according to Example 5 and the methanol/methyl methacrylate azeotrope is separated off continuously. The residue is subjected to fractional distillation in vacuo. This yields 228 g (82% of theory) of neopentanolimide ester. Boiling point: 130°-143° C./0.001 mm Hg; melting point: 64°-74° C.

EXAMPLE 8

Copolymer of

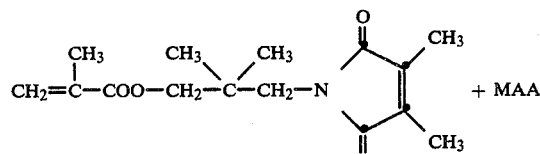

[80:20% by weight]

Using the process according to Example 1, 300 g of neopentanol ester-imide (Example 7), which has been destablished, 75 g of MAA, 2,080 g of 1:1 (V/V) methyl ethyl ketone/methylcellosolve and 2.25 g of AIBN in 45 g of 1:1 MEK/MCS are polymerised.

The polymer yield is quantitative after 22 hours at 65° C.; inherent viscosity=0.25 dl/g.

EXAMPLE 9

Copolymer of

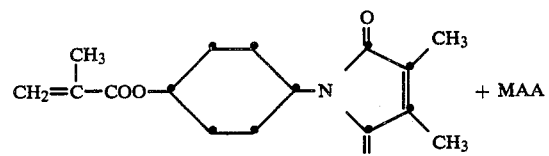

[75:25% by weight]

Using the process according to Example 1, 9.4 g of cyclohexanolimide ester, 3.1 g of MAA, 60.0 g of 1:1 (V/V) methyl ethyl ketone/methylcellosolve and 0.075 g of AIBN in 10.5 g of 1:1 MEK/MCS are polymerised. Polymer yield after 29 hours at 65° C.: 94%. Inherent viscosity: 0.205 dl/g.

The approximately 15% polymer solution is used direct for coating.

EXAMPLE 10

Copolymer of

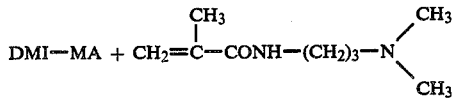

[2:1% by weight]

10.0 g of DMI-MA, 5.0 g of dimethylaminopropylmethacrylamide and 0.075 g of AIBN in 100 ml of toluene are polymerised in an ampoule under nitrogen for 24 hours at 65° C. The product is precipitated in ether and 14.0 g of colourless, solid polymer are obtained.

Yield: 93% of theory.

EXAMPLE 11

9.6 g of DMI-MA, 2.4 g of MAA, 120 mg of DC and 60 mg of AIBN are dissolved in 48 g of dry toluene and polymerised for 41 hours at 60° C. in a 250 ml sulfonation flask provided with a nitrogen inlet, a stirrer, a reflux condenser and a thermometer. The resulting polymer precipitates in the form of a fine powder.

The precipitate is filtered off and dried in vacuo at a temperature below 100° C.

Polymer conversion 89%; inh.V.=0.24 dl/g DMI-MA content in the polymer: 71.1%.

EXAMPLE 12

4.8 g of the compound of the formula

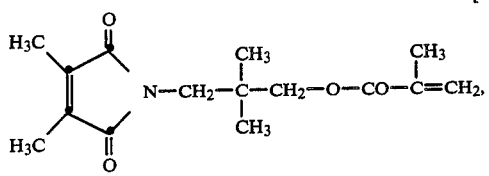

[Example 7]

1.2 g of MAA, 60 mg of DC and 30 mg of AIBN are polymerised in 24 g of dry toluene by the procedure indicated in Example 11. Polymer conversion 69%; inh.V.=0.22 dl/g. DMI-MA content in the polymer: 67.7%.

EXAMPLE 13

4.0 g of DMIMA, 4.0 g compound of Example 7, 2.0 g of MAA, 100 mg of DC and 50 mg of AIBN are polymerised in 40 g of dry toluene for 24 hours at 60° C. by the procedure indicated in Example 11. Polymer conversion: 77.0%, inh.V.=0.25 dl/g; DMI-MA content in the polymer: 57.3%.

EXAMPLE 14

135.0 g of DMIMA, 45.0 g of butyl methacrylate (BuMA), 2.25 g of DC and 1.7 g of AIBN are polymerised in 900 g of dry toluene for 44 hours at 60° C. by the procedure indicated in Example 11.

Polymer conversion: 80.0%; inh.V.=0.29 dl/g; DMI-MA content in the polymer: 55.8%.

EXAMPLE 15

90.0 g of DMIMA, 45.0 g of BuMA, 45.0 g of vinylidene chloride (VC), 45.0 g of MAA, 1.01 g of AIBN and 1.35 g of DC are polymerised in 900 g of dry toluene for 16 hours at 60° C. and then for 24 hours at 70° C. (by the procedure indicated in Example 11).

Polymer conversion: 73%; inh.V.=0.33 dl/g. DMI-MA content in the polymer: 40.6%; VC content in the polymer: 10.3%.

EXAMPLE 16

37.5 g of DMIMA, 18.8 g of BuMA, 18.8 g of MAA, 750 mg of AIBN and 1.13 g of DC are polymerised in 300 g dry toluene for 6 hours at 80° C. by the procedure indicated in Example 11.

Polymer conversion: 74.4%; inh.V.=0.20 dl/g; DMI-MA content in the polymer: 44.0%.

EXAMPLE 17

45.0 g of DMIMA, 15.0 g of BuMA, 15.0 g of MAA, 750 mg of AIBN and 1.13 g of DC are polymerised in 300 g 212.5 g of toluene for 24 hours at 80° C. by a procedure (cf. Example 11) such that a second portion of 750 mg of AIBN and 1.13 g of DC is added after a reaction time of 5.5 hours.

Conversion: 65.0%; inh.V.=0.19 dl/g; DMI-MA content in the polymer: 57.5%.

EXAMPLE 18

7.5 g of the compound of the formula

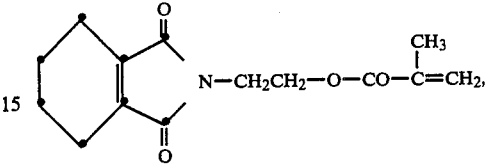

[Example 5]

2.5 g of MAA and 60 mg of AIBN are polymerised in 40 g of dry toluene for 24 hours at 80° C. by the procedure indicated in Example 11.

Polymer conversion: 76.5%.

EXAMPLE 19

6.0 g of DMIMA, 2.0 g of 2-hydroxyethyl acrylate, 2.0 g of MAA, 70 mg of AIBN and 100 mg of DC are polymerised in 40 g of dry toluene for 24 hours at 80° C. by the procedure indicated in Example 11.

Polymer conversion: 69.2%.

EXAMPLE 20

10.0 g of DMIMA, 2.5 g of acrylic acid (AA) and 62.5 mg of AIBN are dissolved in 112.5 g of 1:1 MEK/MCS. An ampoule-like vessel, provided with a connection to a high vacuum and a nitrogen inlet, is filled with the polymerisation solution. Oxygen is removed from the vessel and the polymerisation is then carried out in vacuo at 60° C. for 24 hours.

The polymer is precipitated in ether and dried in vacuo.

Polymer conversion: 68.8%; inh.V.=0.14 dl/g; DMI-MA content in the polymer: 81.8%.

EXAMPLE 21

Polymerisation batch: 8.75 g of DMI-MA, 3.75 g of AA, 62.5 mg of AIBN, 50 g of 1:1 MEK/MCS.

Polymerisation method: as in Example 20.

Polymer conversion: 75.2%; inh.V.=0.21 dl/g; DMI-MA content in the polymer: 76.1%.

EXAMPLE 22

28.3 ml of water and 68.3 mg of potassium persulfate are initially introduced into a 250 ml sulfonation flask which is provided with a nitrogen inlet, a stirrer and a thermometer. The solution is flushed with nitrogen for 30 minutes and the following solutions are then metered in at the same time at 25° C. in the course of 2 hours: (a) 21.2 g of DMIMA, 6.4 g of AA and 11.9 g of ethyl acrylate (EA), (b) 46.7 ml of $H_2O$, 1 ml of a 3.95% ascorbic acid solution and 2.4 ml of a 0.14% iron sulfate solution and (c) 28.3 ml of $H_2O$ and 6.5 ml of a 26.7% solution of nonylphenol-polyethylene glycol-ammonium sulfate.

After the metering in is complete, the reaction solution is allowed to react for further 2 hours under nitrogen. The resulting latex is stable; the particle size is 0.04±0.02 μm. The latex is suitable for direct coating of polyester film.

EXAMPLE 23

Polymer of: 18.4 g of DMIMA, 17.0 g of DMIA, 1.4 g of AA, 2.7 g of methyl methacrylate (MMA) and 0.8 g of thioxanthone (TX) prepared by the procedure of Example 22.

EXAMPLE 24

Polymer of: 18.4 g of DMIMA, 17.0 g of DMIA, 1.4 g of AA, 2.7 g of MMA and 0.40 g of 3-mercaptopropionic acid (MPA), prepared by the procedure of Example 22.

EXAMPLE 25

5.0 g of DMIMA, 5.0 g of 4-vinylpyridine (4VP) and 50 mg of AIBN are polymerised in 40 g of a 1:1 MEK/MCS solvent mixture at 60° C. for 24 hours under nitrogen. The solution is used direct for coating.

Polymer conversion: 89% (precipitated in petroleum ether).

EXAMPLE 26

5.0 g of DMIMA, 5.0 g of 4-VP and 50 mg of AIBN are polymerised in 40 g of dry toluene at 80° C. for 24 hours under nitrogen. The polymer which has precipitated is filtered off and dried in vacuo. Polymer conversion: 95%.

EXAMPLE 27

Latex polymerisation of a copolymer of

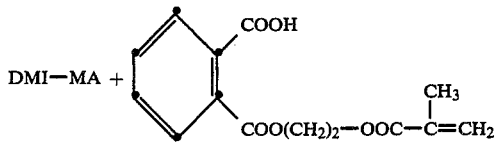

[monomer ratio 50:50% by weight]

400 ml of water, 2 g of $K_2S_2O_8$, 0.5 g of dodecyl-mercaptan, 3 g of nonylphenol-polyethylene glycol-ammonium sulfate (60% in ethanol) and 8 ml of $FeSO_4$ solution (0.15%) are initially introduced into a closed, thermostat-controlled reactor provided with a stirrer, a thermometer and two dropping funnels. The monomer mixture and the activator are added from separate dropping funnels in the course of 3 hours to the solution initially introduced. The monomer mixture consists of 100 g of DMI-MA and 100 g of mono-β-methacryloxyethyl phthalate and 100 g of ethyl acetate. The activator used is a solution of 2 g of $Na_2S_2O_5$ in 300 ml of water. A vacuum is applied to the apparatus and the apparatus is flushed with nitrogen, this operation being carried out three times. Shortly after the start of the addition of the two components, the solution becomes bluish. The temperature is kept at 20° C. After the addition is complete (3 hours), the solution is stirred for a further 1 hour and small amounts of sediment are then separated off by means of a gelatin filter.

The latex can be broken by adding NaCl solution; the polymer is filtered off with suction, washed with ether and dried. Yield: 95%.

Inherent viscosity: 0.145 dl/g.

EXAMPLE 28

Solution polymerisation; copolymer of

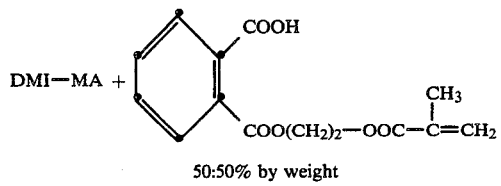

50:50% by weight 75 g of DMI-MA and 75 g of mono-β-methacryloxyethyl phthalate are dissolved in 700 ml of a 1:1 mixture of methyl ethyl ketone and methylcellosolve in a closed, thermostat-controlled 1 liter reactor provided with a thermometer and a dropping funnel. A vacuum is applied to the apparatus and the apparatus is flushed with nitrogen, this procedure being carried out 4 times. The polymerisation is carried out at 60° C. under nitrogen at a slight excess pressure. ⅓ of the AIBN solution (0.9 g of AIBN in 10 ml of the solvent mixture) is added from the dropping funnel at the start and the other ⅔ of the solution are added at 5 hour intervals. After a reaction time of 24 hours, the polymerisation is complete. Yield: 98%; inherent viscosity: 0.187 dl/g.

EXAMPLE 29

8.7 g of the compound of the formula

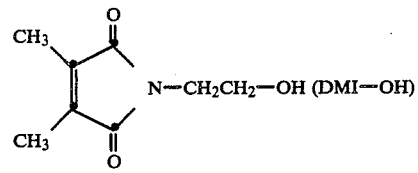

and 6.3 g of an alternating low-molecular weight ethylene/maleic anhydride copolymer (EMA 1103) are dissolved in 40 ml of tetrahydrofuran and the solution is refluxed for 48 hours with the exclusion of moisture. The polymer is isolated by precipitating in ether and is dried in vacuo. It can be concluded from the elementary analysis (C 55.01%; H 6.36%; N 1.84%) that 38% of the anhydride groups have been converted.

EXAMPLE 30

45 g of DMI-MA, 15 g of BuMA, 25 g of MAA, 15 g of 2-ethylhexyl methacrylate (EHMA), 1 g of AIBN and 0.5 g of DC are polymerised in 500 g of dry toluene by the procedure indicated in Example 11. Polymer conversion: 63%; inherent viscosity: 0.27 dl/g. DMI content in the polymer: 42.3%.

EXAMPLE 31

13.3 g of 2-dimethylmaleimidyl ethylvinyl ether (DMI-VE), 6.7 g of maleic anhydride, 100 mg of AIBN and 1 g of MPA are polymerised in 113.3 g of dry benzene by the procedure indicated in Example 11. The resulting polymer is precipitated in 1,000 ml of ether. The precipitate is filtered off and dried in vacuo at a temperature below 100° C. Polymer conversion: 75.5%; inherent viscosity; 0.21 dl/g; DMI-VE content in the polymer: 63.7%.

EXAMPLE 32

5.7 g of DMI-VE, 9.3 g of N,N-dimethylamino-2-ethyl methacrylate (DMAEMA) and 30 mg of AIBN are polymerised in 85 g of dry benzene for 100 hours at 60° C., by the procedure indicated in Example 11. The resulting polymer is precipitated in 700 ml of ether. The precipitate is filtered off and dried in vacuo. Polymer conversion: 92%; inherent viscosity: 0.28 dl/g.

EXAMPLE 33

300 mg of AIBN dissolved in 20 g of MCS are added to a mixture of 10 g of DMI-MA, 10 g of DMAEMA, 12 g of dimethyl sulfate and 80 mg of DC, which has been dissolved in 75 g of isopropanol in a 250 ml sulfonation flask. The polymerisation is carried out at 80° C. for 2 hours under nitrogen. After a further addition of 200 mg of AIBN in 20 g of MCS, the mixture is polymerised for a further 2 hours. The polymer which has precipitated is filtered off and dried in vacuo. Polymer yield: 95%; inherent viscosity: 1.10 dl/g; [0.5% in water; 25° C.].

EXAMPLE 34

Manual coating of a photographic base

5% (based on the weight of the solid polymer) of the sensitiser of the formula

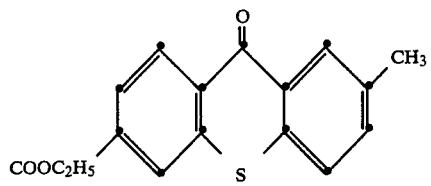

are added, under yellow light, to the approximately 15% polymer solution according to Example 1 and dissolved by warming gently. This solution is coated onto a 100μ thick polyester film using a hand doctor which permits a wet thickness of 25 μm and the coating is dried for 3 minutes at 100° C. A homogeneous, transparent and slightly yellowish coloured, coated polyester film is obtained, the polymer layer applied having a thickness of about 1-2 μm.

EXAMPLE 35

Mechanical coating of a photographic base

A 15% polymer solution, such as, for example, is produced in solution when preparing the polymers according to the invention, is diluted to 9% with the corresponding methyl ethyl ketone/methylcellosolve solvent mixture, and 5% (based on the weight of polymer) of the sensitiser mentioned in Example 34 and 0.3% of a fluorinated wetting agent (FC 430 from the 3M Company) are added under yellow light.

This solution is coated by means of the dipping process onto polyester film (thickness: 100 μm; width: 22 cm) under yellow light, in a test coating machine. The drier (length: 4 m) is at a temperature of 60° C. at the inlet and of 100° C. at the outlet. By changing the coating speed (2 m/minute–5 m/minute), the layer thicknesses can be adjusted between 1.5 and 5 μm. Uniform, non-tacky, yellowish coloured, light-sensitive films are obtained.

EXAMPLE 36

Latex coating 10 ml of latex, for example prepared according to Example 22 or 27 (solids content of 25.9%), are diluted to a solids content of 15% with 7.3 ml of water, 130 mg of the compound of the formula

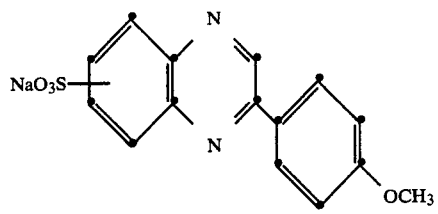

are added and the mixture is applied to the polyester base using a 25 μm doctor. 3 minutes preliminary drying at room temperature is followed by 3 minutes drying at 100° C. Thickness of the dry coating: 3.5 μm.

Coating can also be carried out mechanically, as described in Example 35.

USE EXAMPLES

Example 37

A polymer solution prepared according to Example 3 is applied mechanically to a polyester base by the procedure of Example 35. The films produced in this way are exposed on a copying apparatus (Océ Helioprint 36, 1000 watt metal/halogen lamp at a distance of 53 cm), in contact with a test wedge and through the latter for 30 seconds. The exposed strips are immersed for a certain time in a developer solution of the following composition: 1.25 g of the dye of the formula (20), 1.25 g of the dye of the formula (21), 60 ml of 0.2M tri-sodium phosphate in water, 40 ml of ethylene glycol and 0.75 g of 10% isooctylphenoxypolyethoxyethanol.

The strips are then washed for 15 seconds in running deionised water and dried. The results are listed in Table 1. Orange-coloured images are obtained which have a high optical density, a resolution of >120 lines/mm and screen points of high quality. The material can therefore be used as a contact film for exposing a printing plate.

TABLE 1

| (DMI-MA:MAA:EA = 60:20:20) | | |
|---|---|---|
| Coating speed (m/minute) | Developing time (seconds) | Optical density >3.0 in the indicated range (nm) |
| 3 (layer thickness: about 2.5 μm) | 15 | 413–508 |
| | 30 | 395–523 |
| | 60 | 385–533 |

An analogous procedure is followed using a film obtained according to Example 2 and Example 35. The results are given in Table 2.

TABLE 2

| (DMI-MA:MAA = 70:30) | | |
|---|---|---|
| Coating speed (m/minute) | Developing time (seconds) | Optical density >3.0 in the indicated range (nm) |
| 3 | 15 | 395–525 |
| | 30 | 395–528 |

TABLE 2-continued (DMI-MA:MAA = 70:30)

| Coating speed (m/minute) | Developing time (seconds) | Optical density >3.0 in the indicated range (nm) |
|---|---|---|
| | 60 | 382–535 |

A 15% solution of the polymer according to Example 29 in 1:1 methyl ethyl ketone/methylcellosolve with 5% of the sensitiser of Example 34 is applied to a polyester film in the manner described in more detail in the said example. The light-sensitive film obtained in this way is exposed through a test wedge for 120 seconds and developed, as described above. An orange-coloured image is obtained which shows 9 (out of 10) wedge steps.

Example 38

A light-sensitive film prepared by the processes of Example 1 and Example 35 is exposed, as described in Example 37, for 30 seconds through a microfilm original, which is a conventional silver halide negative of the cathode ray image from a computer. The exposed films are immersed for 15 seconds in a developer solution of the following composition: 1.0 g of the dye of the formula (22), 60 ml of 0.1M tri-sodium phosphate in water, 40 ml of ethylene glycol and 0.75 g of 10% isooctylphenoxypolyethoxyethanol.

The films are then washed in running water for 15 seconds and dried. A copy of the microfilm master is obtained which has transparent characters on a blue background and therefore is easily legible.

Example 39

A light-sensitive film prepared by the process of Example 34 (polymer according to Example 16) is further processed as indicated in Example 38.

The film is exposed for 60 seconds and then immersed for 20 seconds in a developer solution of the following composition: 1.75 g of the dye of the formula (20), 1.25 g of the dye of the formula (21), 100 ml of 0.2M tri-sodium phosphate in water, 0.075 g of isooctylphenoxypolyethoxyethanol and 33 g of ethylene glycol.

The film is then washed in running water for 15 seconds and then dried. The film is stained in the wavelength range of 410 to 570 nm and has an optical density of above 3 and the image has a resolution of more than 150 lines/mm.

Example 40

A light-sensitive film prepared by the process of Example 35 (polymer according to Example 16) is further processed as indicated in Example 38. The film is exposed for 60 seconds and then immersed for 20 seconds in a developer solution of the following composition: 3.0 g of the dye of the formula (23), 1.0 g of sodium carbonate, 100 mg of isooctylphenoxypolyethoxyethanol and 100 ml of water.

The film is then washed in running water for 15 seconds and then dried. A copy of the microfilm master is obtained which has a deeply coloured blue background and is easily legible. The film has a resolution of more than 330 lines/mm.

Example 41

A light-sensitive film prepared by the process of Example 35 (polymer according to Example 16) is further processed as described in Example 38. The film is exposed for 60 seconds and then immersed for 20 seconds in a black developer solution of the following composition: 0.1 g of the dye of the formula (20), 0.1 g of the dye of the formula (18), 0.5 g of the dye of the formula (24), 0.5 g of the dye of the formula (23), 1.0 g of sodium carbonate and 100 ml of water.

The film is washed in running water for 15 seconds and then dried. A copy of the microfilm master on a black background is obtained. The copy has a high resolution of more than 330 lines/mm.

Example 42

A light-sensitive film prepared by the process of Example 34 (polymer according to Example 25) is further processed as described in Example 38.

The film is exposed for 30 seconds and then immersed for 60 seconds in a blue developer solution of the following composition: 3.0 g of the dye of the formula (25), 2.0 g of concentrated acetic acid, 30 g of ethylene glycol and 65 ml of water.

The film is washed in running water for 15 seconds and then dried. The copy has transparent characters on a blue background.

Example 43

8% (based on the weight of polymer) of the sensitiser mentioned in Example 34 and 0.3% of the fluorinated wetting agent mentioned in Example 31 are added, under yellow light, to a polymer solution prepared according to Example 3 and the resulting mixture is diluted (with 4:1 MEK/MCS) to a solids content of 7% and coated mechanically onto a polyester base (0.100 μm thick) by the process of Example 35. Coating speed: 3 m/minute; thickness of the dry layer; about 2 μm. After 30 seconds contact exposure through a test original, the film is developed in a processor which contains 2 baths. The first bath contains a developer solution of the following composition: 1.50 g of the dye of the formula (20), 2.50 g of the dye of the formula (21), 100 ml of 0.25M tri-sodium phosphate in water and 0.75 g of 10% isooctylphenoxypolyethoxyethanol.

Water circulates in the second bath. A hot-air drier is located after the second bath. The film is fed through the bath by means of rubber rolls. The residence time in the two baths is about 7 seconds in each case. Orange-coloured images are obtained which have a high optical density (>3.0) and show no fog and no mechanical damage.

EXAMPLE 44

Manual coating of a photographic base with a copolymer containing basic groups 530 mg of the polymer according to Example (33) and 53 mg of a water-soluble sensitiser of the formula

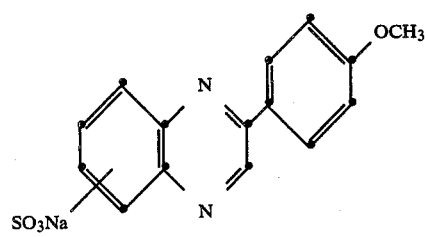

are dissolved in 4.30 g of water under yellow light. This solution is coated onto a 100μ thick polyester film using a 25 μm hand doctor and the coating is dried for 3 minutes at 100° C. The polymer layer applied, which is homogeneous and transparent, has a thickness of about 2–3 μm.

The films prepared in this way are exposed using the procedure of Example 37. The exposed strips are immersed for 20 seconds in a 5% aqueous solution of the compound of the formula

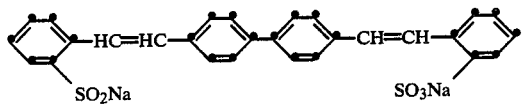

They are then washed in running water for 15 seconds and dried. Images are obtained which have an optical density of 2.3 at $\lambda_{max}=360$ nm.

Example 45

Comparison example

A light-sensitive film prepared by the process of Example 35 (polymer according to Example 1) is exposed for 30 seconds through an original, by the procedure described in Example 37, and developed by 3 methods;

(A) In an alkaline dye solution according to the invention, as described in Example 37.

(B) By a conventional process which requires the following process steps: immersion for 30 seconds in an aqueous 5% sodium carbonate solution, rinsing with water for 5 seconds, immersion for 30 seconds in an aqueous 2% solution of the dyestuff of formula (27) (pH 4.5), rinsing with water for 30 seconds and drying.

(C) Immersion for 30 seconds in an aqueous 0.2 molar trisodium phosphate solution. Further processing as in (B): rinsing with water for 5 seconds, immersion for 30 seconds in an aqueous 2% solution of dyestuff of formula (27), rinsing with water for 30 seconds and drying.

Results

Method (A): Orange-coloured images which adhere well and have a high optical density and resolution.

Method (B): Extensive swelling of the polymer relief during the intermediate rinsing with water; red-coloured images of poor quality; some parts of the image dissolved away.

Method (C): The relief swells very extensively during the intermediate rinsing with water and becomes detached from the base film. No image.

What is claimed is:

1. A process for the production of a photographic image colored with a cationic dye made by exposing imagewise a light-sensitive recording material having, on a base, one layer consisting of a photocrosslinkable polymer, the side chains, of which have photoactive maleimide groupings, wherein the layer consists of at least one copolymer which has an average molecular weight of $10^3$ to $10^6$ and is obtained by free radical polymerisation of a composition consisting of from 10 to 82% by weight of a comonomer (1) selected from the group consisting of those of the formula

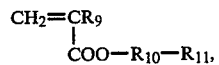 (7)

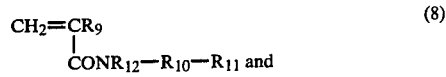 (8)

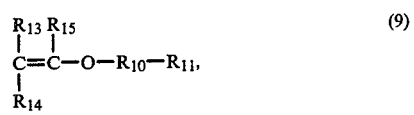 (9)

in which $R_9$ is hydrogen or methyl, $R_{10}$ is straight-chain or branched alkylene having 1 to 12 carbon atoms or cycloalkylene having 5 or 6 carbon atoms, $R_{11}$ is a maleimide grouping of the formula

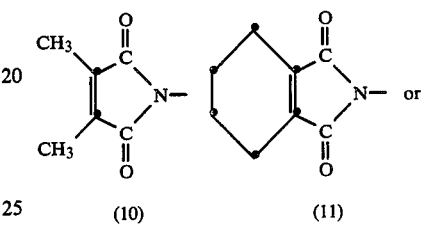

(10)   (11)

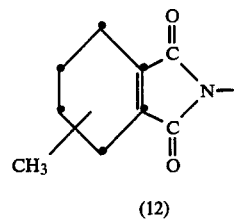

(12)

and $R_{12}$ is hydrogen or alkyl having 1 to 6 carbon atoms and $R_{13}$, $R_{14}$ and $R_{15}$ are each hydrogen, halogen, cyano or alkyl having 1 to 6 carbon atoms, from 18 to 90% by weight of a comonomer (2) which is selected from the group consisting of acrylic acid, methacrylic acid, crotonic acid, maleic acid, fumaric acid, itaconic acid, vinylsulfonic acid, styrenesulfonic acid and phthalic acid/(meth)acrylate half ester, and from 0 to 72% by weight of at least one further ethylenically unsaturated comonomer (3) which differs from the comonomers (1) and (2), the amount of (1), (2) and (3) being 100% by weight, characterized that the comonomer (2) is present in the photocrosslinkable polymer in an amount of at least 18% by weight, based on the total amount of the comonomers, and that the complete development and complete coloring of the exposed recording materials is carried out together in one step in an alkaline, aqueous or aqueous-organic developer-solution having diluted therein a cationic dye in an amount of 0.01 to 10% by weight relating to said solution, and then washing and drying the developed and colored image.

2. A process according to claim 1, wherein the comonomer (1) consists of the formula (7) or (9).

3. A process according to claim 1, wherein the comonomer (1) consists of the formula (7).

4. A process according to claim 3, wherein the comonomer (1) consists of the formula

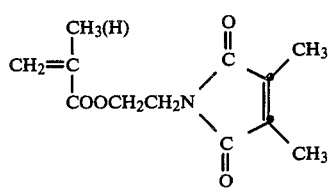

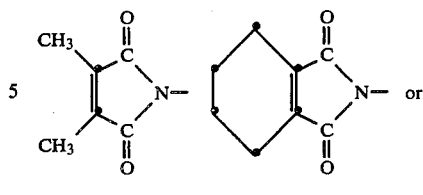

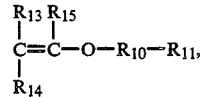

5. A process for the production of a photographic image colored with an anionic dye, made by exposing imagewise a light-sensitive recording material having on a base, one layer consisting of a photocrosslinkable polymer, the side chains of which have photoactive maleimide groupings, wherein the layer consists of at least one copolymer which has an average molecular weight of $10^3$ to $10^6$ and is obtained by free radical polymerisation of a composition consisting of from 10 to 82% by weight of comonomer (1) selected from the group consisting of the formula

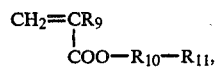 (7)

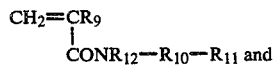 (8)

$$\begin{array}{c} R_{13} \ R_{15} \\ | \ \ | \\ C=C-O-R_{10}-R_{11}, \\ | \\ R_{14} \end{array}$$ (9)

in which $R_9$ is hydrogen or methyl, $R_{10}$ is straight-chain or branched alkylene having 1 to 12 carbon atoms or cycloalkylene having 5 or 6 carbon atoms, $R_{11}$ is a maleimide grouping of the formula and $R_{12}$ is hydrogen or alkyl having 1 to 6 carbon atoms and $R_{13}$, $R_{14}$ and $R_{15}$ are each hydrogen, halogen, cyano or alkyl having 1 to 6 carbon atoms, the comonomer (2) is selected from the group consisting of 2-vinylpyridine, 4-vinylpyridine, dimethylaminoethyl (meth)acrylate, diethylaminoethyl (meth)acrylate, dimethylaminopropyl (meth)acrylate, diethylaminopropyl (meth)-acrylate, dimethylaminopropylmethacrylamide and diethylaminopropylmethacrylamide, and, at least one further ethylenically unsaturated comonomer which differs from the comonomers (1) and (2), the amount of (1), (2) and (3) being 100% by weight, characterized that the comonomer (2) is present in the photocrosslinkable polymer in an amount of at least 18% by weight, based on the total amont of the comonomers, and that the complete development and complete coloring of the exposed recording material is carried out together in one step in an alkaline, aqueous or aqueous-organic developer solution having diluted therein an anionic dye in an amount of 0.01 to 10% by weight relating to said solution, and then washing and drying the developed and colored image.

* * * * *